United States Patent
Ali et al.

(10) Patent No.: US 10,439,020 B2
(45) Date of Patent: Oct. 8, 2019

(54) IN-SITU PLASMA TREATMENT FOR THIN FILM RESISTORS

(71) Applicant: Texas Instruments Incorporated, Dallas, TX (US)

(72) Inventors: Abbas Ali, Plano, TX (US); Dhishan Kande, Dallas, TX (US); Qi-Zhong Hong, Richardson, TX (US); Shih Chang Chang, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/855,635

(22) Filed: Dec. 27, 2017

(65) Prior Publication Data
US 2019/0198603 A1    Jun. 27, 2019

(51) Int. Cl.
*H01L 49/02* (2006.01)
*H01L 21/3213* (2006.01)
*H01L 27/01* (2006.01)

(52) U.S. Cl.
CPC ........ *H01L 28/24* (2013.01); *H01L 21/32138* (2013.01); *H01L 21/32139* (2013.01); *H01L 27/01* (2013.01)

(58) Field of Classification Search
None
See application file for complete search history.

(56) References Cited

U.S. PATENT DOCUMENTS

| 5,001,454 | A  | * | 3/1991 | Yamadera | G01L 1/2287 338/2 |
| 6,171,922 | B1 | * | 1/2001 | Maghsoudnia | H01O 7/006 204/192.21 |
| 6,287,933 | B1 | * | 9/2001 | Iida | H01L 28/24 257/E21.006 |
| 9,455,312 | B2 |   | 9/2016 | Liu et al. | |
| 2011/0086488 | A1 | * | 4/2011 | Ali | C23F 4/00 438/384 |

* cited by examiner

*Primary Examiner* — Ermias T Woldegeorgis
(74) *Attorney, Agent, or Firm* — Andrew R. Ralston; Charles A. Brill; Frank D. Cimino

(57) ABSTRACT

A method of fabricating integrated circuits (ICs) includes depositing a dielectric liner layer on a substrate including a semiconductor surface having a plurality of IC die formed therein each including functional circuitry including a plurality of interconnected transistors. A thin film resistor (TFR) layer including chromium (Cr) is deposited on the dielectric liner layer. The substrate is loaded into a hardmask layer deposition tool that includes a plasma source. The TFR layer is in-situ plasma pre-treated including flowing at least one inert gas and at least one oxidizing gas while in the hardmask layer deposition tool. A hardmask layer is deposited after the plasma pre-treating while remaining in the hardmask layer deposition tool. A pattern is formed on the hardmask layer, and the hardmask layer and TFR layer are etched stopping in the dielectric liner layer to form at least one resistor from the defined TFR layer.

12 Claims, 4 Drawing Sheets

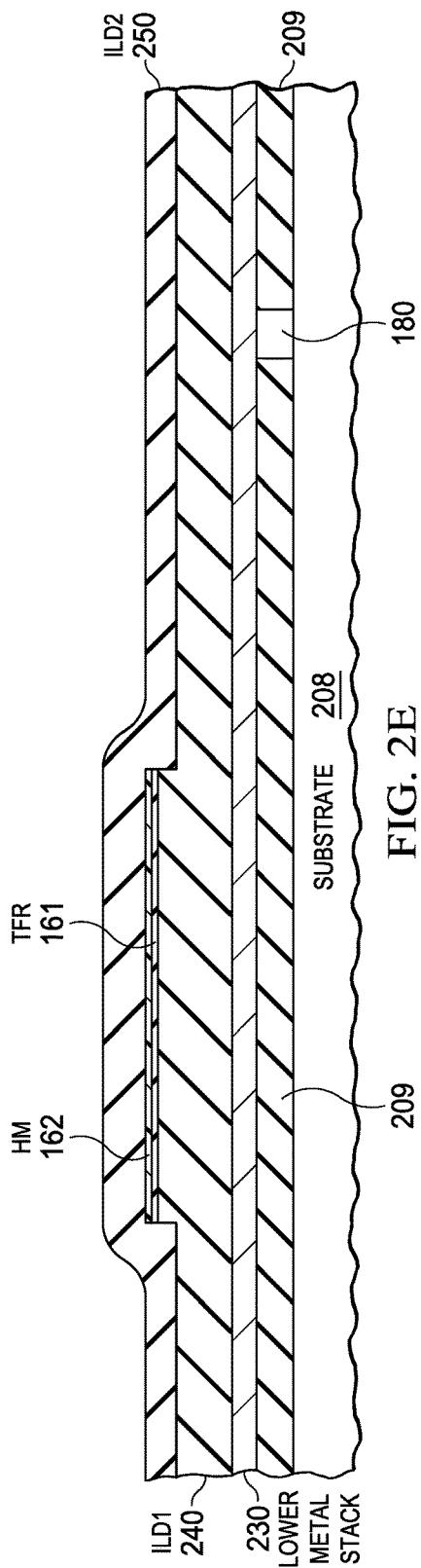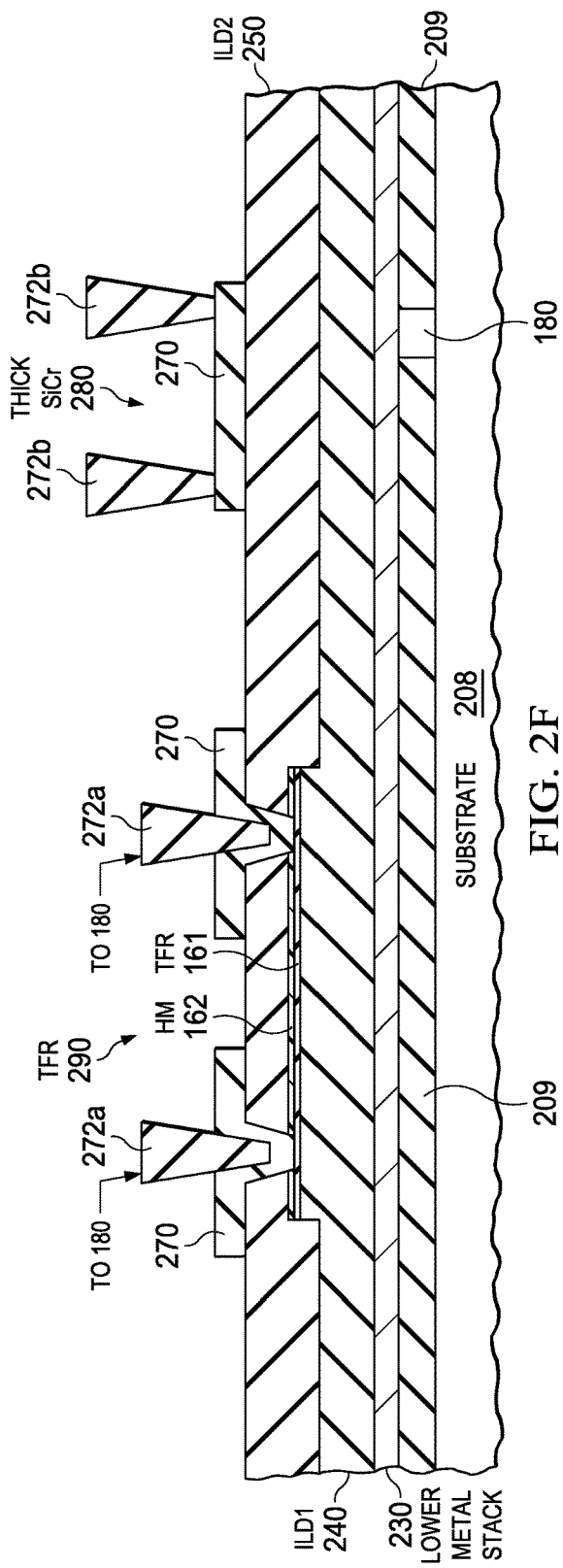

US 10,439,020 B2

IN-SITU PLASMA TREATMENT FOR THIN FILM RESISTORS

FIELD

This Disclosure relates to semiconductor integrated circuit (IC) devices having chromium comprising thin film resistors (TFRs).

BACKGROUND

Some IC devices include TFRs. Silicon Chromium (SiCr) has been used for years for TFRs due to its high electrical resistance in thin film form, relatively low temperature coefficient of resistance (TCR), and the ability to carry relatively high current densities.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure includes a method of fabricating ICs comprising depositing a dielectric liner layer on a substrate (temp: e.g., a wafer) including a semiconductor surface having a plurality of IC die formed therein each including functional circuitry comprising a plurality of interconnected transistors. A TFR layer comprising Cr is deposited on the dielectric liner layer. The substrate is loaded into a hardmask layer deposition tool that includes a plasma source. The TFR layer is in-situ plasma pre-treated including flowing at least one inert gas and at least one oxidizing gas while in the hardmask layer deposition tool. A hardmask layer (e.g., a tetraethoxysilane (TEOS) derived silicon oxide layer) is deposited after the plasma pre-treating while remaining in the hardmask layer deposition tool. A pattern is formed on the hardmask layer, and the hardmask layer and TFR layer are etched stopping in the dielectric liner layer to form at least one resistor that comprises the TFR layer.

BRIEF DESCRIPTION OF THE DRAWINGS

Reference will now be made to the accompanying drawings, which are not necessarily drawn to scale, wherein:

FIGS. 2A-2F are cross-sectional diagrams showing processing progression for an example method of forming an IC having at least one TFR, according to an example aspect.

DETAILED DESCRIPTION

Figure 1:
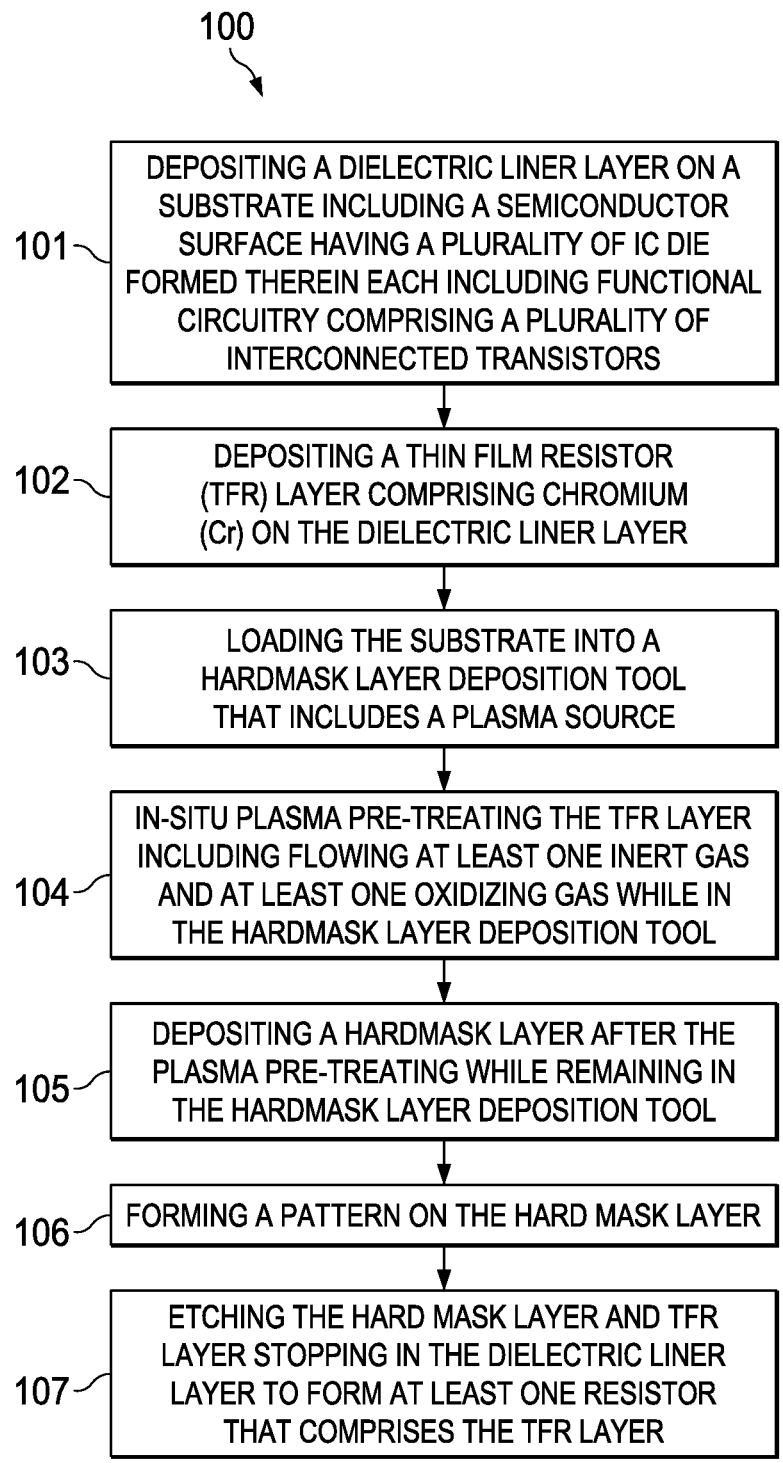
FIG. 1 is a flow chart that shows steps in an example method of fabricating ICs including TFRs, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

The Disclosure recognizes for conventionally formed Cr comprising TFRs on ICs there is the problems of poor TFR uniformity (poor TFR matching characteristics) and high TCR. For example, for $Si(x)C(y)Cr(z)$, and its alloys, where x, y and z represent atomic percentages and y that can be zero for SiCr, as well as for NiCr and its alloys, resistance uniformity and TCR problems may exist particularly when the TFRs are <50 nm thick. SiCr is a commonly selected TFR material due to its unique figure of merit (FOM) characteristics such as a relatively low TCR (e.g., about −10 to +10 ppm/° C., but generally ≥|5| ppm/° C.) when used as a relatively high value resistor for an IC.

FIG. 1 is a flow chart that shows steps in an example method 100 of fabricating ICs including TFRs, according to an example aspect. Step 101 comprises depositing a dielectric liner layer on a substrate including a semiconductor surface having a plurality of IC die (e.g., a wafer) formed therein each including functional circuitry comprising a plurality of interconnected transistors. The functional circuitry (see functional circuitry 180 in FIGS. 2A-2F described below) is generally formed in the substrate before forming the TFRs. Functional circuitry as used herein realizes and carries out a desired functionality, such as that of a digital IC (e.g., digital signal processor) or analog IC (e.g., amplifier or power converter), and in one aspect a BiCMOS (MOS and Bipolar) IC. The capability of functional circuitry provided on a disclosed IC may vary, for example ranging from a simple device to a complex device. The specific functionality contained within functional circuitry is not of importance to disclosed ICs.

The substrate can comprise a bulk substrate material such as silicon, or an epitaxial layer on a bulk substrate material. Alternatively, the substrate can comprise silicon-germanium, other Group 4 material, or other semiconductor materials including III-V and II-VI compound semiconductor materials.

The dielectric liner layer can comprise a TEOS-derived silicon oxide layer. However, other dielectric films can also be used including deposited silicon oxides such as comprising an organosilicate glass (OSG), a low-k dielectric (i.e., a smaller dielectric constant relative to silicon dioxide), a doped dielectric layer such as a fluorine-doped silica glass (FSG), or a SiN layer or its variants (e.g., SiON).

Step 102 comprises depositing a TFR layer comprising Cr on the dielectric liner layer. The deposition process can comprise a direct current (DC) or radio frequency (RF) sputtering process. The TFR layer can comprise SiCr or its alloys such as carbon containing including SiCCr, SiCOCr where C can be 1 atomic % to 50 atomic %, or NiCr or its alloys such as NiCrFe 61% Ni, 15% Cr, 24% Fe (all atomic % s). The thickness of the TFR layer is generally 1 nm to 50 nm, such as 2 nm to 10 nm, or about 4 nm in one specific aspect.

Step 103 comprises loading the substrate (e.g., a wafer) into a hardmask layer deposition tool that includes a plasma source. One example apparatus that can be used is an Applied Materials, Inc. chemical vapor deposition (CVD) system that includes a remote plasma source for chamber cleans or a conventional plasma enhanced CVD (PECVD) system. Step 104 comprises in-situ plasma pre-treating the TFR layer including flowing at least one inert gas and at least one oxidizing gas while in the hardmask layer deposition tool. A temperature range of 300 to 500° C. may be used. The at least one inert gas can comprise Ar or He and the at least one oxidizing gas can comprise $O_2$, $O_3$, or $N_2O$. In one specific example, an Ar and $O_2$ plasma pre-treatment may be used for a SiCr layer prior to an in-situ TEOS hardmask deposition. The RF power used during the plasma pre-treating is generally 100 kW to 4 MW, such as 500 kW and 1 MW.

Step 105 comprises depositing a hardmask layer (e.g., a TEOS derived hardmask layer) after the plasma pre-treating while remaining in the hardmask layer deposition tool. Step 106 comprises forming a pattern on the hardmask layer. Photoresist can be used to form a pattern. This deposition process can comprise low pressure CVD (LPCVD) at a pressure of about 300 mTorr and at a temperature of about 700° C. for a TEOS-based deposition process. The hardmask layer thickness range can be 20 A to 300 A.

Step 107 comprises etching the hardmask layer and TFR layer stopping in the dielectric liner layer to form at least one resistor that comprises the TFR layer. The etch gases for hardmask etch in the case of silicon oxide can be Ar and $CF_4$ with optional $Cl_2$. The etch gases used for etching the TFR layer generally includes flowing $O_2$, $Cl_2$, and at least one carbon-halogen gas. For example, $O_2$, $Cl_2$, and $CF_4$ with optional Ar may be used for etching SiCr. In addition other gasses may also be used for etching the TFR layer such as $CHF_3$, OR $CH_2F_2$ as a replacement for or in addition to $CF_4$, and/or $N_2$ used as well.

Figure 2A:
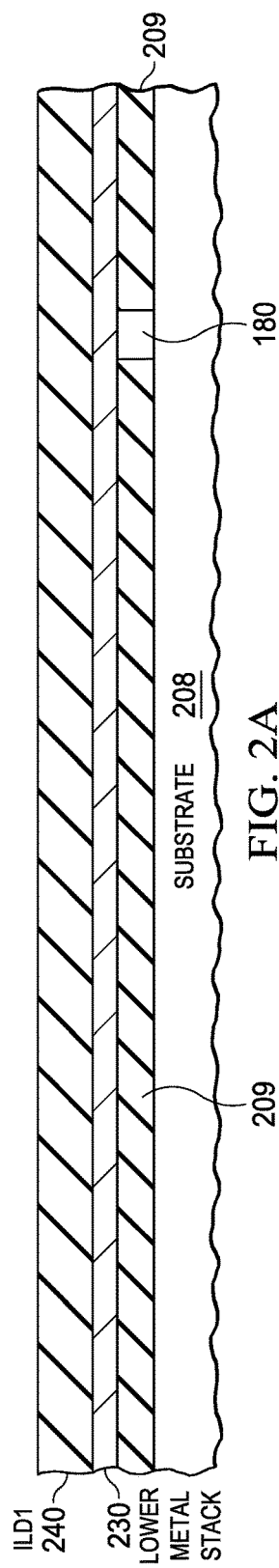

FIGS. 2A-2F are cross-sectional diagrams showing processing progression for an example method of forming an IC having at least one TFR, according to an example aspect. FIG. 2A shows an in-process IC comprising a substrate 208 having at least a semiconductor surface layer 209 (e.g., an epitaxial layer) where the functional circuitry 180 which comprises a plurality of transistors formed in the semiconductor surface layer 209 shown as a block was earlier formed. As described above, the substrate 208 and/or semiconductor surface layer 209 can comprise silicon, silicon-germanium, or other semiconductor material. There is a lower metal stack 230 on the semiconductor surface layer 209, and an interlevel dielectric layer shown as ILD 1 layer 240 which may be referred to as a liner layer on the lower metal stack 230.

Figure 2B:
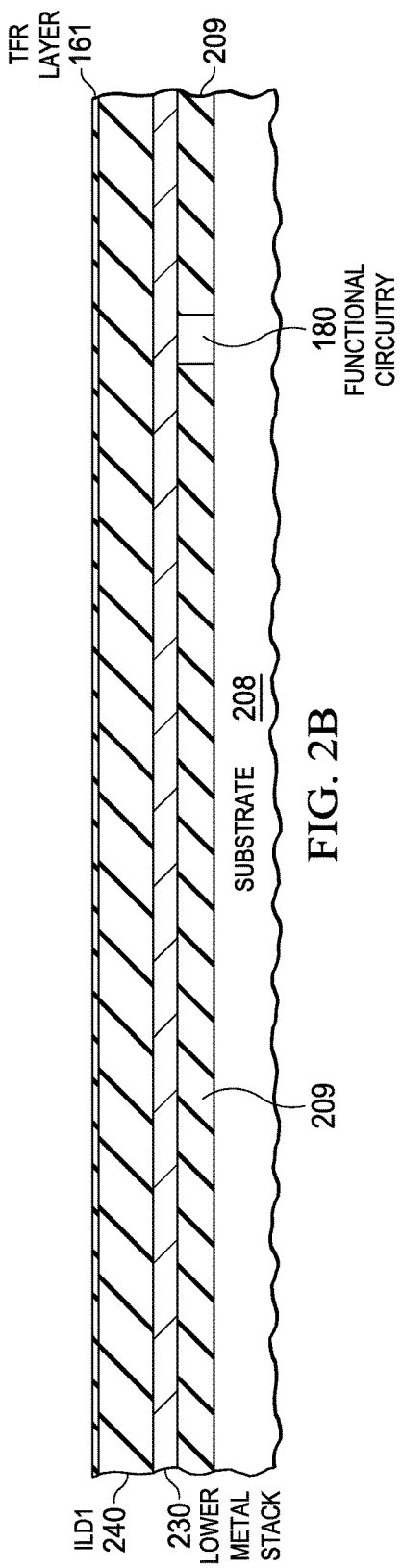
Figure 2C:
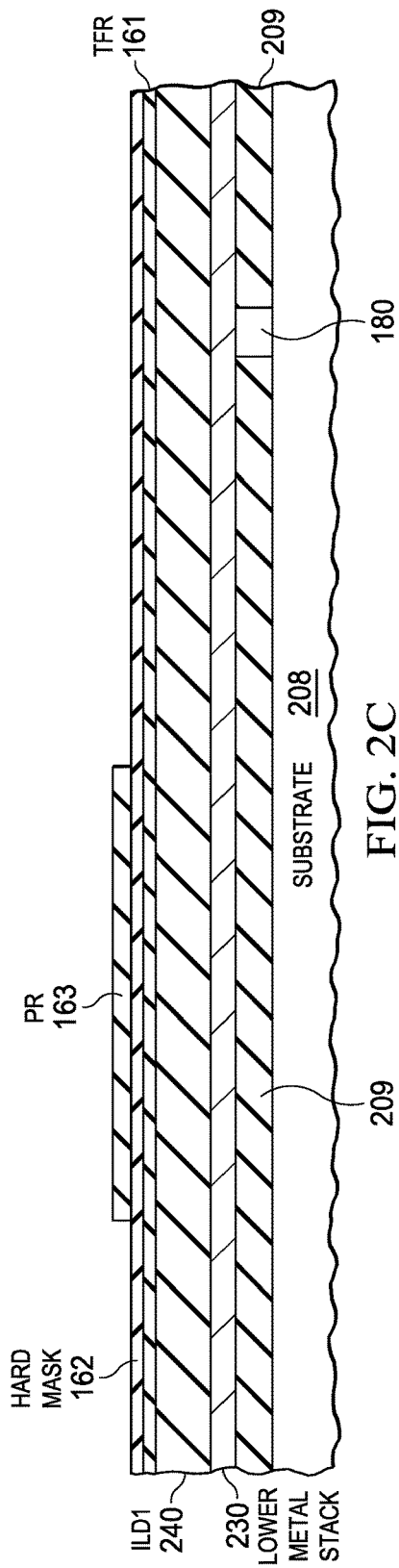

FIG. 2B shows the in-process IC after the deposition of the TFR layer 161 on the ILD 1 layer 240. FIG. 2C shows the in-process IC after the deposition of the hardmask layer 162 on the TFR layer 161. As described above, there is an in-situ plasma pre-treating of the TFR layer 161 including flowing at least one inert gas and at least one oxidizing gas while in the hardmask layer deposition tool before depositing the hardmask layer 162. A photoresist (PR) layer 163 pattern is also shown on the hardmask layer 162.

Figure 2D:
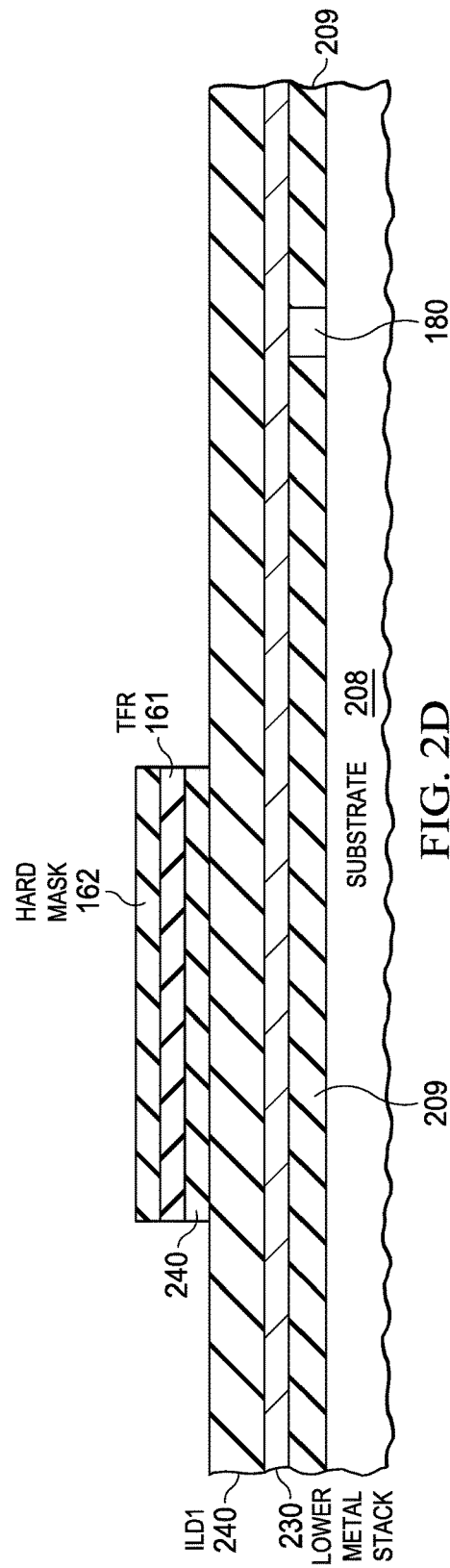

FIG. 2D shows the in-process IC after etching the hardmask layer 162 and TFR layer 161 to define TFRs and after stripping of the PR layer 163. This etch stops in the ILD 1 layer 240. FIG. 2E shows the in-process IC after the deposition of a second ILD (ILD2) layer 250. The ILD 2 layer 250 generally comprises a deposited silicon oxide.

FIG. 2F shows the in-process IC after forming vias through the ILD2 layer 250 and hardmask layer 162 to expose contacts on the TFR layer 161, and then depositing and patterning another metal layer shown by example as a thick SiCr layer 270 (being thick as compared to TFR layer 161, such as at least 10 times thicker, e.g., 50 A to 600 A thick). The thick SiCr layer 270 can be called the TFR head which is shown on top of the ILD2 layer 250. A plasma etch or a wet etch can be used to form vias in the ILD2 layer 250 for the TFR heads.

After depositing the thick SiCr layer 270 another hardmask layer is then deposited which is then patterned, and then this hardmask layer and the thick SiCr layer 270 are etched. Another ILD oxide is then deposited (not shown), patterned, and is then etched to form vias which are then filled with an electrically conductive material to form the vias lands shown in FIG. 2F, with the via lands 272a providing contacts for contacting the thick SiCr layer 270 over the TFR layer 161 to form TFR 290, and via lands 272b contacting the thick SiCr layer 270 over the ILD2 250 to provide the thick SiCr resistor 280 shown. The IC can then then be completed by conventional back end of the line (BEOL) processing comprising forming one or more additional metal levels thereon including a top metal level. The top metal layer can comprise aluminum (or an aluminum alloy) or copper. Passivation overcoat (PO) then generally follows, followed by patterning the PO. The PO layer comprises at least one dielectric layer such as silicon oxide, silicon nitride, or SiON.

In the final IC, the TFRs having a TFR layer 161 including a Cr comprising layer (such as TFR 290 shown in FIG. 2F) are connected within the functional circuitry that as described above generally have a thickness of 1 nm to 50 nm. The Cr comprising TFR layer 161 also has a minimum oxygen concentration of 10 atomic % throughout its full thickness. The concentration of oxygen in the TFR layer 161 can be 10% to 70% atomic %, with a typical $O_2$ concentration being about 60 to 65 atomic %. A TCR of the TFRs can be less than or equal (≤) 5 ppm, such as ≤3 ppm/° C. (see the Examples section described below).

EXAMPLES

Disclosed aspects are further illustrated by the following specific Examples, which should not be construed as limiting the scope or content of this Disclosure in any way.

Disclosed TFRs were formed from SiCr on silicon wafers using disclosed in-situ plasma pre-treating the TFR layer comprising flowing Ar and $O_2$ in a hardmask layer deposition tool having an RF plasma source at 400° C. for 5 to 30 seconds, followed by a TEOS-based silicon oxide hard mask deposition providing a silicon oxide thickness of about 100 A. TFRs were also formed using another SiCr process for comparison using ex-situ pre-treatment in an ashing apparatus utilizing an $O_2$ plasma for some wafers with and for some wafers without any subsequent hardmask layer. Sheet resistance (Rs) data was obtained from each group. The nominal TFR thickness was 32 A and the nominal TFR Rs was 1,000 ohms. The data was obtained from >10,000 TFRs confirmed the Rs uniformity (the range of Rs data) was improved by disclosed in-situ plasma pre-treating from around 17% to around 12% or less. The average TCR matching for the TFRs was reduced by the disclosed in-situ plasma pre-treating from 11 to 13 ppm/° C. to ≤3 ppm/° C.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating integrated circuits (ICs), comprising:
   depositing a dielectric liner layer on a substrate including a semiconductor surface having a plurality of IC die formed therein each including functional circuitry comprising a plurality of interconnected transistors;
   depositing a thin film resistor (TFR) layer comprising chromium (Cr) on said dielectric liner layer;
   loading said substrate into a hardmask layer deposition tool that includes a plasma source;
   in-situ plasma pre-treating said TFR layer including flowing at least one inert gas and at least one oxidizing gas while in said hardmask layer deposition tool;
   depositing a hardmask layer after said plasma pre-treating while remaining in said hardmask layer deposition tool;
   forming a pattern on said hardmask layer, and
   etching said hardmask layer and said TFR layer stopping in said dielectric liner layer to form at least one resistor that comprises said TFR layer.

2. The method of claim 1, wherein said TFR layer comprises silicon chromium (SiCr).

3. The method of claim 2, wherein said SiCr layer further comprises carbon.

4. The method of claim 3, wherein said thickness of said TFR layer is in a range between about 2 nm and about 10 nm.

5. The method of claim 1, wherein said at least one inert gas comprises Ar or He, and wherein said at least one oxidizing gas comprises $O_2$, $O_3$, or $N_2O$.

6. The method of claim 5, wherein said inert gas comprises said Ar and wherein said oxidizing gas comprises $O_2$.

7. The method of claim 1, wherein a thickness of said TFR layer is in a arrange between about 1 nm and about 50 nm.

8. The method of claim 1, wherein said depositing said hardmask layer comprises utilizing tetraethyl orthosilicate (TEOS) as a precursor material.

9. The method of claim 1, wherein a radio frequency (RF) power used during said plasma pre-treating is within a range between about 100 kW and about 4 MW.

10. The method of claim 1, wherein said etching said hardmask layer comprises flowing $O_2$, $Cl_2$, and at least one carbon-halogen gas.

11. A method of fabricating integrated circuits (ICs), comprising:
    depositing a dielectric liner layer on a substrate including a semiconductor surface having a plurality of IC die formed therein each including functional circuitry comprising a plurality of interconnected transistors;
    depositing thin film resistor (TFR) layer comprising silicon chromium (SiCr) on said dielectric liner layer, wherein a thickness of said TFR layer is in a range between about 2 nm and about 10 nm;
    loading said substrate into a hardmask layer deposition tool that includes a plasma source;
    in-situ plasma pre-treating said TFR layer including flowing at least one inert gas and at least one oxidizing gas while in said hardmask layer deposition tool;
    depositing a hardmask layer after said plasma pre-treating while remaining in said hardmask layer deposition tool;
    forming a pattern on said hardmask layer, and
    etching said hardmask layer and said TFR layer stopping in said dielectric liner layer to form at least one resistor that comprises said TFR layer.

12. The method of claim 11, wherein said depositing said hardmask layer comprises utilizing tetraethyl orthosilicate (TEOS) as a precursor material, and wherein said inert gas comprises Ar and wherein said oxidizing gas comprises $O_2$.

* * * * *